(12) United States Patent
Jindal et al.

(10) Patent No.: US 9,201,116 B1
(45) Date of Patent: Dec. 1, 2015

(54) METHOD OF GENERATING TEST PATTERNS FOR DETECTING SMALL DELAY DEFECTS

(71) Applicants: Anurag Jindal, Patiala (IN); Naman Gupta, Delhi (IN); Sagar Kataria, Noida (IN); Pragya Shukla, Noida (IN)

(72) Inventors: Anurag Jindal, Patiala (IN); Naman Gupta, Delhi (IN); Sagar Kataria, Noida (IN); Pragya Shukla, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 27 days.

(21) Appl. No.: 14/340,572

(22) Filed: Jul. 25, 2014

(51) Int. Cl.
*G01R 31/28* (2006.01)
*G01R 31/3177* (2006.01)

(52) U.S. Cl.
CPC .................................. *G01R 31/3177* (2013.01)

(58) Field of Classification Search
CPC ................. G01R 31/31858; G01R 31/318594; G01R 31/318392
USPC ......................................................... 714/726
See application file for complete search history.

(56) References Cited

U.S. PATENT DOCUMENTS

| 8,051,352 | B2 * | 11/2011 | Lin ..................... G06F 17/5009 714/724 |
| 8,122,409 | B2 * | 2/2012 | Lackey .......... G01R 31/318307 716/111 |
| 8,352,818 | B2 | 1/2013 | Goel et al. |
| 8,515,695 | B2 * | 8/2013 | Devta-Prasanna G01R 31/31835 702/108 |
| 8,527,232 | B2 * | 9/2013 | Guo .................. G01R 1/318328 702/117 |
| 8,566,766 | B2 | 10/2013 | Goel et al. |
| 2006/0242507 | A1 * | 10/2006 | Acharya .......... G01R 1/318594 714/726 |
| 2008/0154571 | A1 * | 6/2008 | Arayama ............ G06F 17/5031 703/19 |

FOREIGN PATENT DOCUMENTS

CN 102621477 8/2012

OTHER PUBLICATIONS

Xijiang Lin et al., "Timing Aware ATPG for High Quality At-Speed Testing of Small Delay Defects", 15 Asian Test Symposium (ATS '06), IEEE Computer Society, 2006.

* cited by examiner

*Primary Examiner* — David Ton
(74) *Attorney, Agent, or Firm* — Charles Bergere

(57) ABSTRACT

A method of generating test patterns for testing a semiconductor processor for small delay defects (SDD) includes modifying interconnect delay values of interconnect paths by introducing values corresponding to (i) set-up and clock to Q delays of elements in the paths and (ii) latencies of associated clock networks. Critical nodes are selected and test patterns targeting the selected critical nodes are generated using timing slack resulting from the modified interconnect delays. A first selection of nodes that are critical in at-speed scan mode testing and a second selection of nodes that are critical in functional mode testing are made by static timing analysis (STA). Only the nodes featuring in both the first and second selections are selected for targeting small delay defects using at-speed scan test patterns.

13 Claims, 3 Drawing Sheets

SET-UP DELAY ADJUSTMENT

CLOCK to Q DELAY ADJUSTMENT

CLOCK DELAY ADJUSTMENT

METHOD OF GENERATING TEST PATTERNS FOR DETECTING SMALL DELAY DEFECTS

BACKGROUND OF THE INVENTION

The present invention is directed to testing semiconductor devices and, more particularly, to generating test patterns for detecting small delay defects in semiconductor processors.

Testing semiconductor processors during manufacture enables defects to be detected and is typically performed using automatic test equipment (ATE). Test patterns are usually generated by an automatic test pattern generator (ATPG). The test patterns are used to detect static defects, such as stuck-at defects and bridge defects.

Correct operation of the processor is often limited by timing considerations. Static timing analysis (STA) provides data that enables some analysis of simplified delay models and identification of some issues such as set-up and hold time violations, glitches, and clock skew, using definitions of critical paths and corners. The Device Under Test (DUT) can be tested in at-speed scan mode and in functional mode.

Delay testing commonly uses transition delay (TD) patterns created by ATPG tools to detect TD defects along selected paths of the DUT. However, TD patterns are inefficient in detecting a number of small delay defects (SDDs).

Small delay defects (SDD) are delays that are much smaller than the clock period. The accumulation of SDDs along critical paths with short timing slack may give an unacceptable failure rate of devices that are timing critical and subject to process variables caused by layout, mask production, and semiconductor processing variations, for example. The number of test patterns required to fully cover all fault locations of a complex processor is very high and the run time of such full test pattern generation is prohibitive.

The selection of limited numbers of paths and test patterns limits the run time of the test pattern generation. The paths targeted are selected with algorithms using fault models and static timing information (for example from a standard delay format (SDF) file). The selection of the paths suitable for SDD analysis is performed using the timing information interpreted by the tool. Due to the inaccurate interpretation of the delays, selection typically excludes a proportion of critical paths, and in addition TD patterns have not accurately targeted the critical paths for SDDs, particularly, leading to insufficient fault coverage.

Due to limitations in the timing analysis performed by the tools, and data not taken into account for some types of delay, the timing calculation and hence the selection of most suitable candidates targeted for SDD is inaccurate. Moreover, when the tool selects the path to target a particular node it may not be through the most critical path because of the inaccurate timing interpreted by the tool. The test pattern quality is then impacted twice in the process.

Thus, it would be advantageous to have a method for generating test patterns that detect SDDs better and that have acceptable run times.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION OF PREFERRED EMBODIMENTS

FIGS. 1 to 4 illustrate a method 400 of generating test patterns for testing an integrated circuit such as a processor for small delay defects (SDDs) in accordance with embodiments of the invention. The method 400 comprises providing static timing data 402, 404 for interconnect paths that link sequential elements of the processor. The static timing data includes interconnect delay values $D_{I/C}$ of the interconnect paths, set-up and clock to Q delays $T_S$ and $T_{CLK2Q}$ of the sequential elements of the paths, and latencies L of the associated clock networks. The interconnect delay values $D_{I/C}$ of the interconnect paths are modified by introducing values corresponding to set-up and clock to Q delays $T_S$ and $T_{CLK2Q}$ of the sequential elements of the paths and to latencies L of the associated clock networks. Critical nodes to target are selected and test patterns targeting the selected critical nodes are generated using timing slack resulting from the modified interconnect delays $D_{I/C}$.

Modifying the interconnect delay values $D_{I/C}$ may include adding to the interconnect delay value $D_{I/C}$ at the input of each of the sequential elements the set-up time requirement $T_S$ for the input of the element relative to a clock reference, and/or adding to the interconnect delay value $D_{I/C}$ at the output of each of the sequential elements the clock to Q delay requirement $T_{CLK2Q}$ for the output of the element relative to a clock reference.

Modifying the interconnect delay values $D_{I/C}$ for each element of a group of elements may include subtracting from the interconnect delay value $D_{I/C}$ at the input of the element the difference $\Delta L$ between the clock latency L at that element from the minimum clock latency $L_{MIN}$ at the group of the elements, and adding the difference $\Delta L$ to the interconnect delay value $D_{I/C}$ at the output of the element. If the modified interconnect delay value $D_{I/C}$ at the input of at least one of the elements is negative, modifying the interconnect delay values $D_{I/C}$ may include adding the largest modulus $MOD(D_{I/C})$ of the negative interconnect delay value $D_{I/C}$ to the interconnect delay value $D_{I/C}$ at the input and the output of each of the elements, and adding twice the largest modulus (2*MOD($D_{I/C}$)) to the clock periods used in generating the test patterns.

Modifying the interconnect delay values $D_{I/C}$ of the interconnect paths in this way enables the selection of relevant critical nodes and the selection of faults to target to be based on more complete and accurate timing data without increasing unduly the run times of the test pattern generation.

An embodiment of the invention includes a non-transitory computer-readable storage medium storing instructions that, when executed by a computer, cause the computer to perform a method 400 as described above of generating test patterns for testing an integrated circuit for SDDs.

Figure 5:
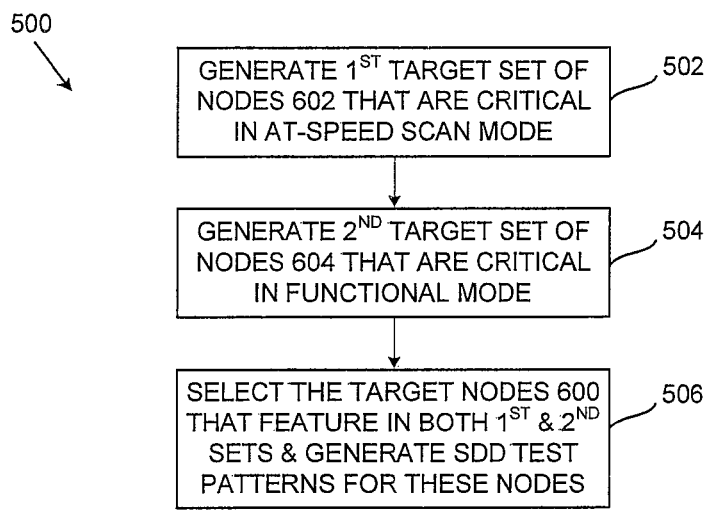
FIG. 5 is a flow chart of a method of generating test patterns for testing a semiconductor processor device for small delay defects (SDDs) in accordance with another embodiment of the invention.
Figure 6:
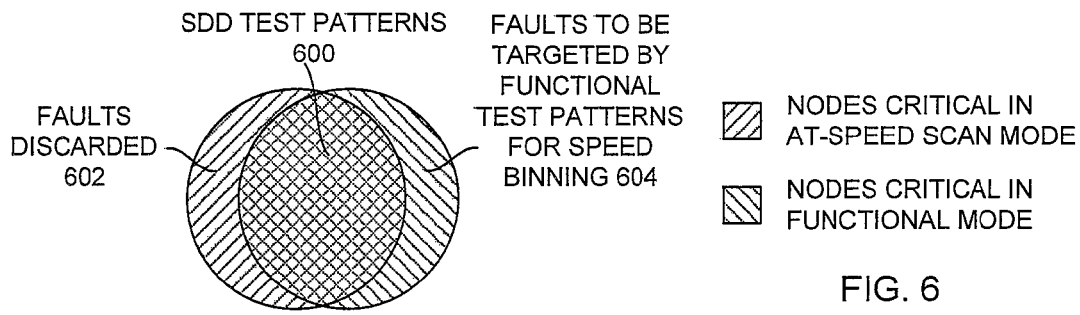
FIG. 6 is a diagram illustrating selection of test patterns in the method of FIG. 5.

As illustrated in FIGS. 5 and 6, an embodiment of the invention includes a method 500 of generating test patterns for testing an integrated circuit such as a processor for SDDs. The method 500 comprises at 502 selecting a first set of nodes that are critical in at-speed scan testing mode according to STA data. At 504, a second set of nodes that are critical in functional mode according to STA data is selected. At 506, the nodes 600 in both the first and second sets are selected, and SDD test patterns targeting these nodes are generated. The faults of nodes 602 that are in the first set and are critical for at-speed scan testing mode but are not timing critical for functional mode can be discarded, since SDD testing of these nodes is unlikely to reveal any devices that are functionally unacceptable. The nodes 604 in the second set and that are critical in functional mode but are not timing critical for at-speed scan testing can be left out of the SDD testing, since speed binning using functional mode test patterns (classifying the products according to speed performance and process, voltage and temperature parameters) will eliminate any products that have functional mode defects anyway. It will be appreciated that all products that have not already been eliminated otherwise will typically be subjected to speed binning.

Figure 1:
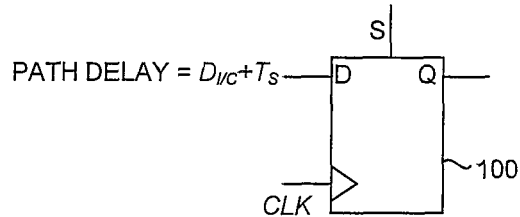
FIG. 1 is a schematic diagram of modification of an interconnect delay value of an interconnection path for the set-up time requirement of a flip-flop in accordance with an embodiment of the invention.
Figure 2:
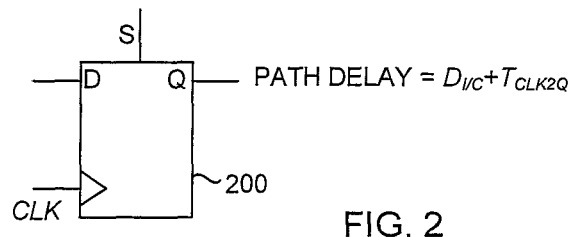
FIG. 2 is a schematic diagram of modification of an interconnect delay value of an interconnection path for the clock to Q delay requirement of a flip-flop in accordance with an embodiment of the invention.

FIGS. 1 and 2 illustrate modifying the interconnect delay value $D_{I/C}$ of an interconnect path at the input of a flip-flop 100 and the output of a flip-flop 200 respectively by adding values corresponding to the set-up and clock to Q delay requirements $T_S$ and $T_{CLK2Q}$ of the flip-flops 100 and 200. The setup and clock to Q delay timing requirements define a time interval during which the data signal must remain stable in order for a reference transition of a clock signal CLK to store the data successfully in the flip-flop. The setup time requirement $T_S$ defines the part of the interval before the clock transition, and the clock to Q delay requirement $T_{CLK2Q}$ defines the part of the interval after the clock transition.

Figure 3:
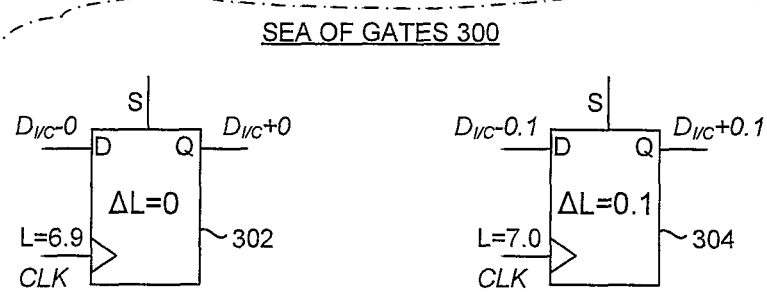
FIG. 3 is a schematic diagram of modification of interconnect delay values of interconnection paths for the dispersion of clock latencies for a group of flip-flops in accordance with an embodiment of the invention.

The latencies of clock signals CLK for a group 300 of elements may be different and the dispersion of the latencies may be influenced by differences between different clock domains and differences in clock signal distribution networks. FIG. 3 illustrates modifying the interconnect delay values $D_{I/C}$ of interconnect paths at the inputs and the outputs of flip-flops 302 to 308 in the group 300 for examples of values of clock latency L of 6.9 at flip-flop 302, 7.0 at flip-flop 304, 7.3 at flip-flop 306 and 7.1 at flip-flop 308. In this example, the minimum clock latency $L_{MIN}$ at the group 300 is 6.9 at flip-flop 302. The difference ΔL between the clock latency L at each flip-flop 302 to 308 from the minimum clock latency $L_{MIN}$ is calculated. The respective difference ΔL is subtracted from the interconnect delay value $D_{I/C}$ at the input of each flip-flop 302 to 308, and is added to the interconnect delay value $D_{I/C}$ at the output of the element. This adjustment translates the clock latency dispersion (or skew) into a corresponding adjustment to the delays of the interconnect paths.

This adjustment may result in a negative interconnect delay value $D_{I/C}$ at the input of one or more of the flip-flops 302 to 308. The automatic test pattern generator (ATPG) will ignore when calculating timing slack values. In order to ensure that the clock latency dispersion adjustment is fully taken into account, the largest modulus MOD($D_{I/C}$) of the negative interconnect delay value $D_{I/C}$ in all the flip-flops is added to the interconnect delay value $D_{I/C}$ at the input and the output of each of the flip-flops and saved in the static timing analysis (STA) file. Then twice the largest modulus (2*MOD($D_I/C$)) is added to the clock period definitions in the ATPG SDD test pattern parameters.

Figure 4:
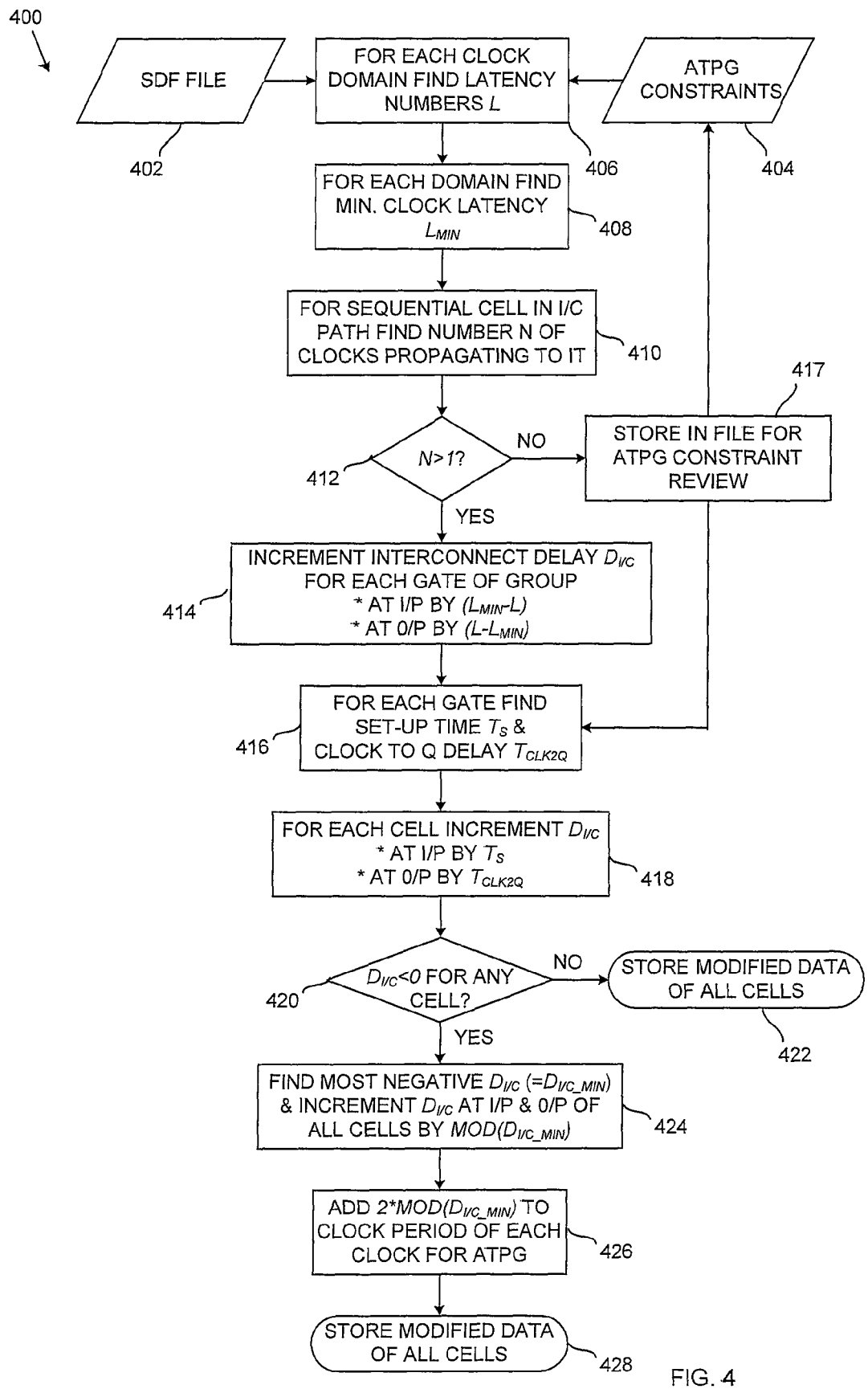
FIG. 4 is a flow chart of a method of generating test patterns for testing a semiconductor processor device for small delay defects (SDDs) in accordance with an embodiment of the invention.

FIG. 4 is a flow chart illustrating the method 400 of generating test patterns for testing a semiconductor processor device for SDDs in accordance with an embodiment of the invention. Static timing data is provided in files 402 and 404 containing standard delay format timing data and ATPG timing constraints. At 406, for each clock domain the clock latency numbers L are found. At 408, the minimum clock latency $L_{MIN}$ for the domain is found. For each sequential cell in the interconnect path, the number N of clocks propagating to the cell is found at 410, and at 412, if the number N is greater than 1, the process continues to step 414. At 414, the difference ΔL between the clock latency L at each cell of the group 300 from the minimum clock latency $L_{MIN}$ is subtracted from the interconnect delay value $D_{I/C}$ at the input of the cell, and is added to the interconnect delay value $D_{I/C}$ at the output of the element, and the process continues to step 416. If the number N is no greater than 1 at the step 412, the data is stored in a file at 417 for subsequent review and the process continues directly to step 416.

At 416, the set-up time requirement $T_S$ and the clock to Q delay requirement $T_{CLK2Q}$ for each cell is found. At 418, for each cell, the set-up time requirement $T_S$ is added to the interconnect delay value $D_{I/C}$ at the input of the cell and the clock to Q delay requirement $T_{CLK2Q}$ is added to the interconnect delay value $D_{I/C}$ at the output of the cell.

A decision is taken at 420 whether any interconnect delay value $D_{I/C}$ is negative. If not, the modified data for all the cells is stored and the test patterns are generated based on the modified data at 422. At 424, if any interconnect delay value $D_{I/C}$ is negative, the modulus MOD($D_{I/C}$) of the most negative interconnect delay value $D_{I/C}$ in all the flip-flops is added to the interconnect delay value $D_{I/C}$ at the input and the output of each of the flip-flops. Then twice the largest modulus (2*MOD($D_{I/C}$)) is added to the clock period definitions in the ATPG SDD test pattern parameters at 426. At 428, the modified data for all the cells is stored and the test patterns are generated based on the modified data.

FIG. 5 is a flow chart illustrating the method 500 of generating test patterns for testing a semiconductor processor device for SDDs in accordance with an embodiment of the invention. The method 500 comprises at 502 selecting a first set of nodes that are critical in at-speed scan testing mode according to STA data. At 504, a second set of nodes that are critical in functional mode according to STA data are selected. At 506, nodes 600 featuring in both the first set and the second set are selected, and SDD test patterns targeting these nodes are generated. The SDD test patterns may be at-speed scan test mode patterns.

FIG. 6 is a diagram illustrating selection of target nodes in the method 500. The target nodes 600 featuring in both the first set of nodes that are timing critical in at-speed scan testing mode, and also in the second selection of nodes that are timing critical in functional mode are selected. The faults of nodes 602 that feature in the first set but are not timing critical for functional mode are discarded. The nodes 604 that feature in the second selection but are not timing critical for at-speed scan testing are left out of the SDD testing.

Figure 7:
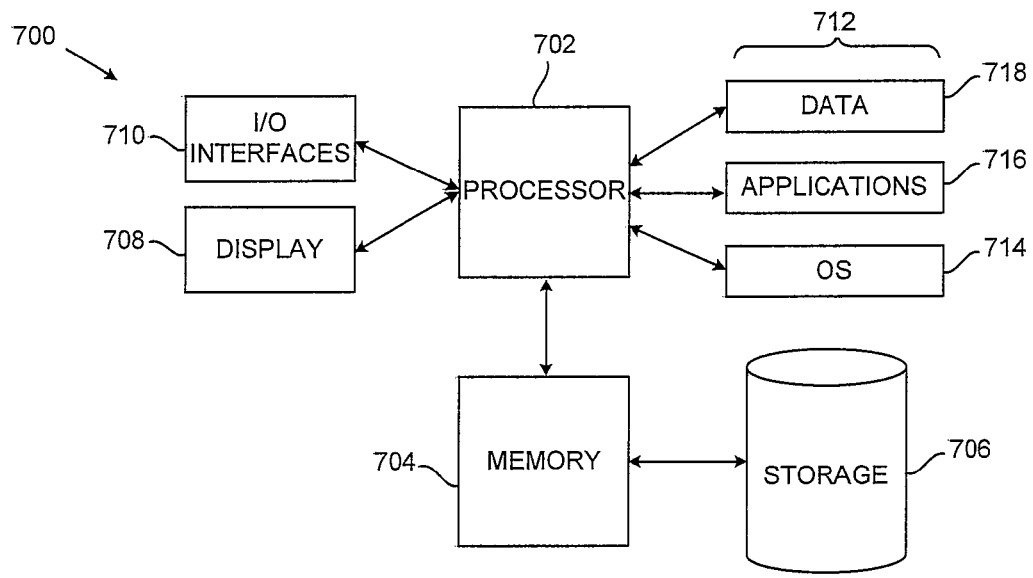
FIG. 7 is a schematic block diagram of an automatic test pattern generator (ATPG) used in performing the methods of FIGS. 1 to 6.

FIG. 7 is a schematic block diagram of a computer used as an ATPG tool 700 for performing the methods of the present invention described above. The ATPG tool 700 includes a processor 702 coupled to a memory 704 and additional memory or storage 706 coupled to the memory 704. The ATPG tool 700 also includes a display device 708, input/output interfaces 710, and software 712. The software 712 includes operating system software 714, applications programs 716, and data 718. The ATPG tool 700 generally is known in the art except for the software used to implement the method described above regarding generating test patterns for testing a semiconductor processor device for SDDs. When software or a program is executing on the processor 702, the processor becomes a "means-for" performing the steps or instructions of the software or application code running on the processor 702. That is, for different instructions and different data associated with the instructions, the internal circuitry of the processor 702 takes on different states due to different register values, and so on, as is known by those of skill in the art. Thus, any means-for structures described herein relate to the processor 702 as it performs the steps of the methods disclosed herein.

The invention may also be implemented at least partially in a non-transitory machine-readable medium containing a computer program for running on a computer system, the program at least including code portions for performing steps of a method according to the invention when run on a programmable apparatus, such as a computer system or enabling a programmable apparatus to perform functions of a device or system according to the invention.

The computer program may be stored internally on computer readable storage medium or transmitted to the computer system via a computer readable transmission medium. All or some of the computer program may be provided on non-transitory computer-readable media permanently, removably or remotely coupled to an information processing system. The computer-readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM and so on; and data transmission media including computer networks, point-to-point telecommunication equipment, and carrier wave transmission media, just to name a few.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the words 'comprising' or 'having' do not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of generating test patterns for testing an integrated circuit (IC) for small delay defects (SDDs), the method comprising:
provided static timing data for interconnect paths that link sequential elements of the IC, the static timing data including interconnect delay values of the interconnect paths, set-up and clock to Q delays of sequential elements of the paths, and latencies of associated clock networks;
modifying the interconnect delay values of the interconnect paths by introducing values corresponding to set-up and clock to Q delays of the sequential elements of the paths and to latencies of the associated clock networks; and selecting critical nodes to target and generating test patterns targeting the selected critical nodes using timing slack resulting from the modified interconnect delays.

2. The method of claim 1, wherein modifying the interconnect delay values includes adding to the interconnect delay value at the input of each of the sequential elements the set-up time requirement for the input of the element relative to a clock reference.

3. The method of claim 1, wherein modifying the interconnect delay values includes adding to the interconnect delay value at the output of each of the sequential elements the clock to Q delay requirement for the output of the element relative to a clock reference.

4. The method of claim 1, wherein modifying the interconnect delay values for each element in a clock domain includes subtracting from the interconnect delay value at the input of the element the difference between the clock latency at that element from the minimum clock latency for the clock domain, and adding the difference to the interconnect delay value at the output of the element.

5. The method of claim 4, wherein if the modified interconnect delay value at the input of at least one of the elements is negative, modifying the interconnect delay values includes adding the largest modulus of the negative interconnect delay value to the interconnect delay value at the input and the output of each of the elements, and twice the largest modulus is added to the clock periods used in generating the test patterns.

6. A method of generating test patterns for testing an integrated circuit (IC) for small delay defects (SDDs), the method comprising:
    selecting a first set of nodes that are critical in at-speed scan testing mode according to static timing data;
    selecting a second set of nodes that are critical in functional mode according to static timing data; and
    generating test patterns for SDDs that target nodes in both the first and second sets.

7. The method of claim 6, further comprising testing ICs for SDDs using the generated test patterns.

8. The method of claim 7, further comprising using functional mode test patterns for the nodes of the second set for speed binning purposes.

9. A non-transitory computer-readable storage medium storing instructions that, when executed by a computer, cause the computer to perform a method of generating test patterns for testing an integrated circuit (IC) for small delay defects (SDDs), the method comprising:
    providing static timing data for interconnect paths that link sequential elements of the IC, the static timing data including interconnect delay values of the interconnect paths, set-up and clock to Q delays of sequential elements of the paths, and latencies of associated clock networks;
    modifying the interconnect delay values of the interconnect paths by introducing values corresponding to set-up and clock to Q delays of the sequential elements of the paths and to latencies of the associated clock networks; and
    selecting critical nodes to target and generating test patterns targeting the selected critical nodes using timing slack resulting from the modified interconnect delays.

10. The non-transitory computer-readable storage medium of claim 9, wherein modifying the interconnect delay values includes adding to the interconnect delay value at the input of each of the sequential elements the set-up time requirement for the input of the element relative to a clock reference.

11. The non-transitory computer-readable storage medium of claim 9, wherein modifying the interconnect delay values includes adding to the interconnect delay value at the output of each of the sequential elements the clock to Q delay requirement for the output of the element relative to a clock reference.

12. The non-transitory computer-readable storage medium of claim 9, wherein modifying the interconnect delay values for each element in a clock domain includes subtracting from the interconnect delay value at the input of the element the difference between the clock latency at that element from the minimum clock latency for the clock domain, and adding the difference to the interconnect delay value at the output of the element.

13. The non-transitory computer-readable storage medium of claim 9, wherein if the modified interconnect delay value at the input of at least one of the elements is negative, modifying the interconnect delay values includes adding the largest modulus of the negative interconnect delay value to the interconnect delay value at the input and the output of each of the elements, and twice the largest modulus is added to the clock periods used in generating the test patterns.

* * * * *